United States Patent
Sugimoto et al.

(10) Patent No.: US 7,074,726 B2
(45) Date of Patent: Jul. 11, 2006

(54) SUBSTRATE TREATING METHOD AND SUBSTRATE TREATING APPARATUS

(75) Inventors: Hiroaki Sugimoto, Kyoto (JP); Takeshi Yoshida, Kyoto (JP); Hiroshi Kato, Kyoto (JP); Takuya Kuroda, Kyoto (JP); Tadashi Sasaki, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 358 days.

(21) Appl. No.: 10/355,960

(22) Filed: Jan. 30, 2003

(65) Prior Publication Data
US 2003/0140949 A1 Jul. 31, 2003

(30) Foreign Application Priority Data
Jan. 31, 2002 (JP) .............................. 2002-024365

(51) Int. Cl.
*H01L 21/302* (2006.01)

(52) U.S. Cl. ........................... 438/745; 134/2; 430/329

(58) Field of Classification Search ............... 134/2, 134/3; 430/329, 331; 438/745, 748
See application file for complete search history.

(56) References Cited

U.S. PATENT DOCUMENTS

| 6,000,862 | A | 12/1999 | Okuda et al. | |
| 6,334,229 | B1 * | 1/2002 | Moinpour et al. | 15/77 |
| 6,432,622 | B1 * | 8/2002 | Moon et al. | 430/331 |
| 6,458,518 | B1 * | 10/2002 | Moon et al. | 430/329 |
| 6,502,271 | B1 * | 1/2003 | Epshteyn | 15/77 |
| 6,632,289 | B1 * | 10/2003 | Masui et al. | 134/3 |
| 2002/0127500 | A1 * | 9/2002 | Moon et al. | 430/329 |

FOREIGN PATENT DOCUMENTS

| JP | 5-119482 | 5/1993 |
| JP | 9-199410 | 7/1997 |
| JP | 11-87226 | 3/1999 |

\* cited by examiner

*Primary Examiner*—Kin-Chan Chen
(74) *Attorney, Agent, or Firm*—Ostrolenk, Faber, Gerb & Soffen, LLP

(57) ABSTRACT

In a substrate treating unit, a removal liquid supplying mechanism supplies a removal liquid to the surface of a substrate. In order to retain the removal liquid on the surface of the substrate for a fixed time, a spin chuck is operated to spin the substrate at such a low speed as to retain the removal liquid on the substrate, or spins the substrate intermittently, or temporarily stops spinning of the substrate. Thus, treatment with the removal liquid progresses without a further supply of the removal liquid, thereby restraining consumption of the removal liquid.

17 Claims, 8 Drawing Sheets

F I G. 7
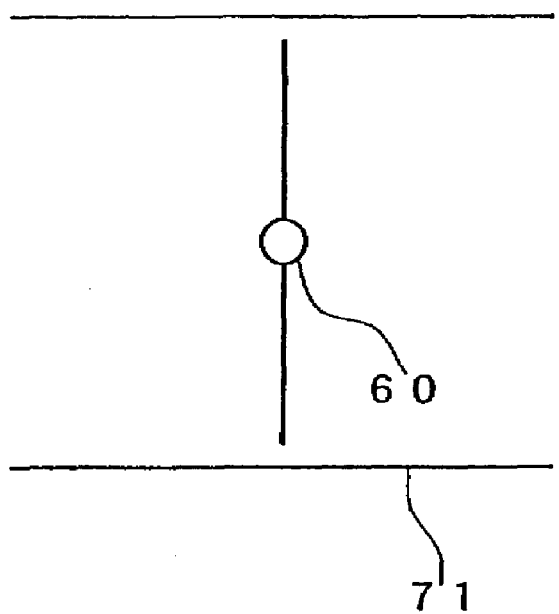
F I G. 8
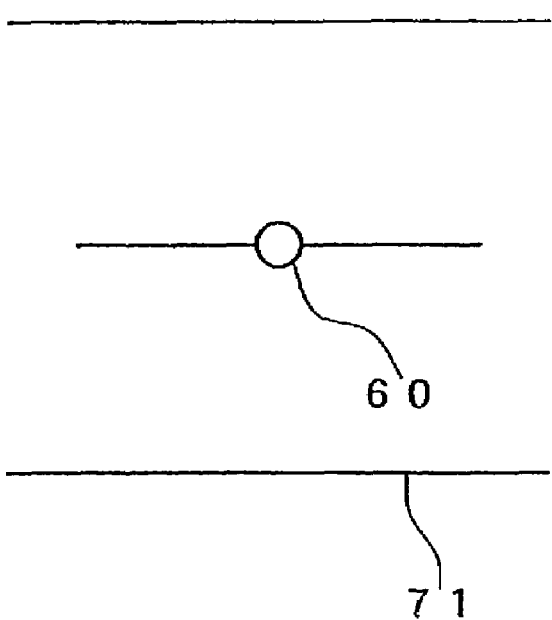

SUBSTRATE TREATING METHOD AND SUBSTRATE TREATING APPARATUS

BACKGROUND OF THE INVENTION

1. Field of the Invention

This invention relates to a substrate treating method and substrate treating apparatus for removing organic substances from substrates. In particular, the invention relates to a substrate treating method and substrate treating apparatus for removing a reaction product, which is an organic substance, from substrates. More particularly, the invention relates to a substrate treating method and substrate treating apparatus for removing, by using a removal liquid, a reaction product generated on surfaces of substrates having a patterned film formed by dry etching using a resist film as a mask.

2. Description of the Related Art

In manufacture of semiconductor devices, an etching process is carried out to make a pattern, by using a resist film as a mask, from a film of metal such as aluminum, copper or the like formed on the surface of a substrate, e.g. semiconductor wafer. For forming a microcircuit pattern in the etching process, dry etching such as RIE (Reactive Ion Etching) is employed.

Reactive ions used in dry etching have such strong power as to resolve the resist film to some extent before the etching of the metal film is completed. Part of the resist film undergoes a change in property, turns into a reaction product such as a polymer, and deposits on side walls of the metal film. This reaction product cannot be removed in a resist removing process to follow. It is therefore necessary to remove the reaction product after the resist removing process.

Conventionally, therefore, a reaction product removing process is carried out after the dry etching process, to remove the reaction product from the side walls of the metal film by supplying the substrate with a removal liquid capable of removing the reaction product. The above "reaction product resulting from a change in property of the resist" is an organic substance. A process may also be carried out to supply the substrate with an organic substance removal liquid for removing other organic substances from the substrate.

With increasingly fine patterns and changes in preliminary processes of late years, the reaction product now has diverse properties. This poses a problem that the conventional removing process requires a long time for removing the reaction product. As a solution to this problem, a substrate treating apparatus of the single-substrate or piecemeal processing type has been developed to replace a substrate treating apparatus that immerses substrates into a removal liquid. This piecemeal type apparatus removes the reaction product by supplying a removal liquid to the surface of a substrate held and spun by a spin chuck inside a scatter preventive cup. The piecemeal type substrate treating apparatus has advantages of improved displacement efficiency of the removal liquid and reduced consumption of deionized water and an intermediate rinse solution for cleaning the substrates. As noted above, the reaction product has diverse properties, and the conventional removing process requires a long time for removing the reaction product. The above piecemeal type substrate treating apparatus has been developed to realize improved displacement efficiency of the removal liquid and reduced consumption of deionized water and the intermediate rinse solution.

The removal liquid used in such a substrate treating apparatus requires cost for post-discharge treatment, and a restraint on its usage is desired. However, the conventional substrate treating apparatus is designed without sufficient consideration as to the restraint on usage of such removal liquid.

Further, such a substrate treating apparatus uses a hot removal liquid, and a gas containing chemical components generates from this removal liquid. When an intermediate rinse solution is used, a gas containing chemical components generates also from the intermediate rinse solution. A diffusion of such gases containing chemical components could affect equipment installed outside a substrate treating unit in the substrate treating apparatus, or affect results of substrate treatment by the equipment.

Thus, it is conceivable to prevent the gases containing chemical components from diffusing outside the scatter preventive cup by exhausting the atmosphere from the scatter preventive cup. It has been found, however, that a substrate treating apparatus for removing organic substances as well as the reaction product (hereinafter referred to simply as organic substances) cannot effectively remove the organic substances when the atmosphere in the scatter preventive cup is exhausted in time of substrate treatment.

That is, the removal liquid used for removing the organic substances, as distinct from a liquid developer used for development, characteristically has a small moisture content. Thus, the removal liquid loses some of its capability for removing the organic substances and cannot remove the organic substances effectively when the moisture in the removal liquid vaporizes due to air currents generated by exhaustion of the atmosphere from the scatter preventive cup. The air currents thus generated may ruffle the surface of the removal liquid or oxidize the removal liquid. These phenomena could also be the cause of the ineffective removal of the organic substances.

Such lowering of the capability for removing the organic substances is salient particularly when, after the removal liquid is supplied to the surface of a substrate, the substrate is temporarily stopped spinning, or is spun at such a low speed as to prevent the removal liquid scattering from the substrate, or is spun intermittently.

SUMMARY OF THE INVENTION

The object of this invention, therefore, is to provide a substrate treating method and substrate treating apparatus capable of restraining usage of a removal liquid.

The above object is fulfilled, according to this invention, by a substrate treating method for removing, by using a removal liquid, a reaction product from a surface of a substrate having a film formed on the surface and patterned by dry etching with a resist film acting as a mask, the method comprising a removal liquid supplying step for supplying the removal liquid to the surface of the substrate while spinning the substrate, and a removal liquid retaining step for retaining the removal liquid on the surface of the substrate for a fixed time.

With this substrate treating method, the reaction product may be removed quickly in the removal liquid retaining step without using a large quantity of removal liquid.

In one preferred embodiment, the removal liquid retaining step is executed, after the removal liquid is supplied to the surface of the substrate, for spinning the substrate at such a low speed as to retain the removal liquid on the substrate.

In another preferred embodiment, the removal liquid retaining step is executed, after the removal liquid is supplied to the surface of the substrate, for spinning the substrate intermittently.

In a further preferred embodiment, the removal liquid retaining step is executed, after the removal liquid is supplied to the surface of the substrate, for temporarily stopping spinning of the substrate.

Preferably, the removal liquid supplying step, removal liquid retaining step, removal liquid scattering step and substrate cleaning step are executed while the substrate is placed in a cup being exhausted, the cup being less exhausted during the removal liquid supplying step and removal liquid retaining step. Consequently, organic substances including the reaction product may be removed effectively from the substrate while preventing diffusion to the ambient of a gas containing the chemical components of the removal liquid.

In another aspect of the invention, a substrate treating method is provided for removing an organic substance from a substrate by using a removal liquid, the method comprising a removal liquid supplying step for supplying the removal liquid to a surface of the substrate, and a removal liquid retaining step for retaining the removal liquid on the surface of the substrate for a fixed time.

In a further aspect of the invention, a substrate treating apparatus is provided for removing an organic substance from a substrate by using a removal liquid, the apparatus comprising a spin chuck for supporting and spinning the substrate, and a removal liquid supplying mechanism for supplying the removal liquid to a surface of the substrate supported by the spin chuck, wherein the spin chuck is operable, after the removal liquid supplying mechanism supplies the removal liquid to the surface of the substrate, in one of modes for spinning the substrate at such a low speed as to retain the removal liquid on the substrate, for spinning the substrate intermittently, and for temporarily stopping spinning of the substrate.

Other features and advantages of the invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 7 is an enlarged view schematically showing an exhaust regulating valve;

FIG. 8 is an enlarged view schematically showing the exhaust regulating valve.

DESCRIPTION OF THE PREFERRED EMBODIMENTS

Figure 1:
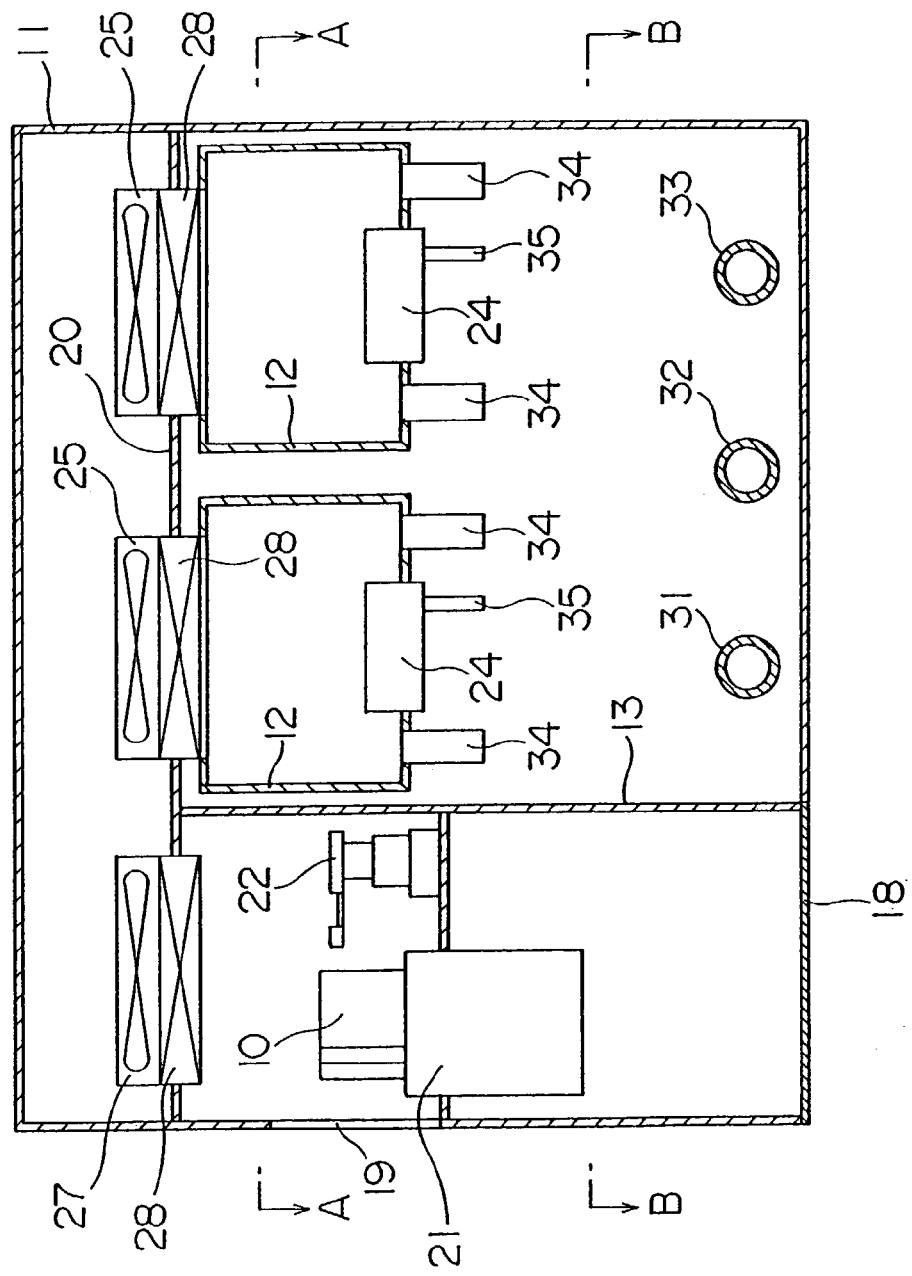
FIG. 1 is a view in vertical section of a substrate treating apparatus according to this invention.
Figure 2:
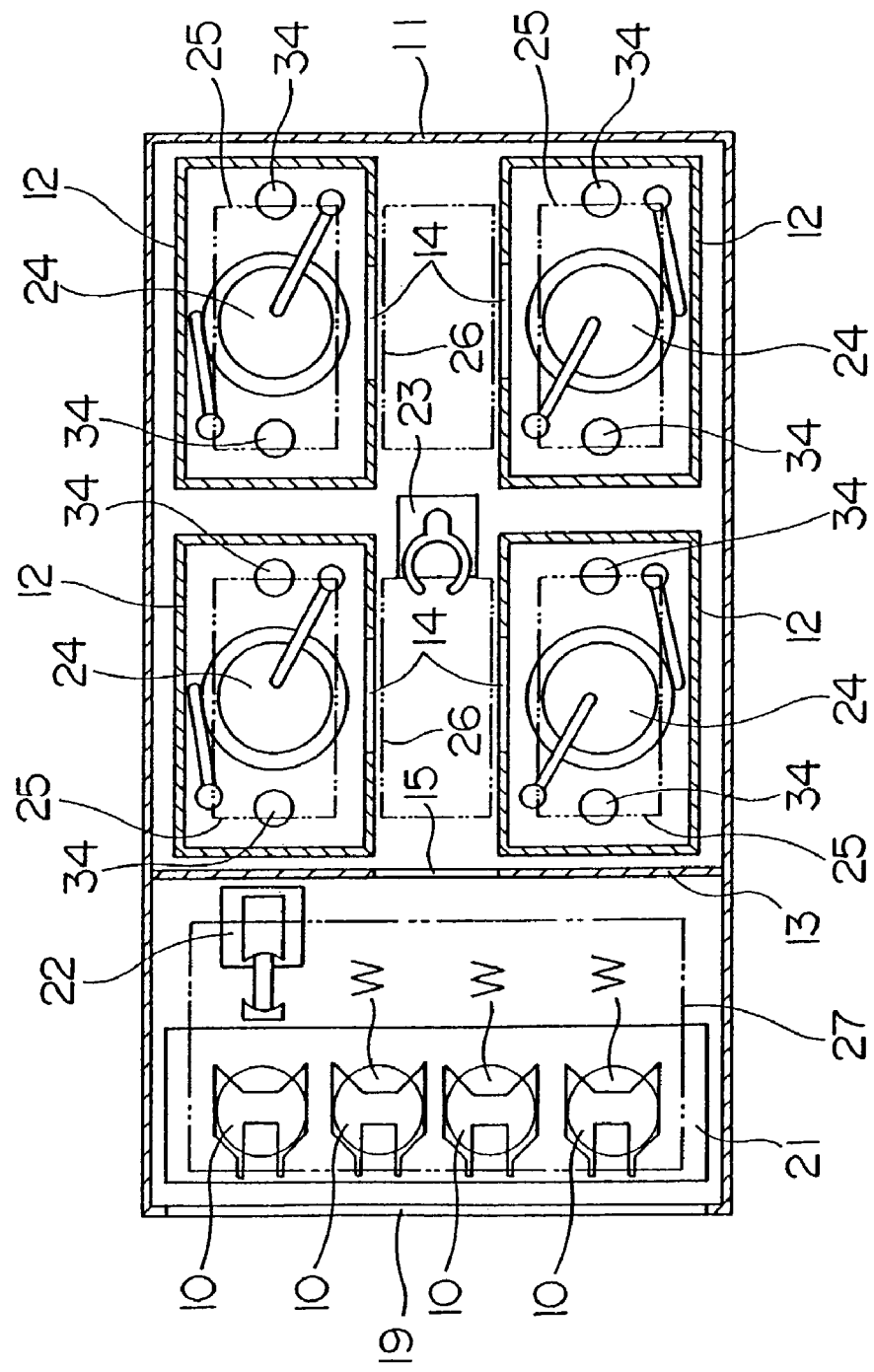
FIG. 2 is a section taken on line A—A of FIG. 1.
Figure 3:
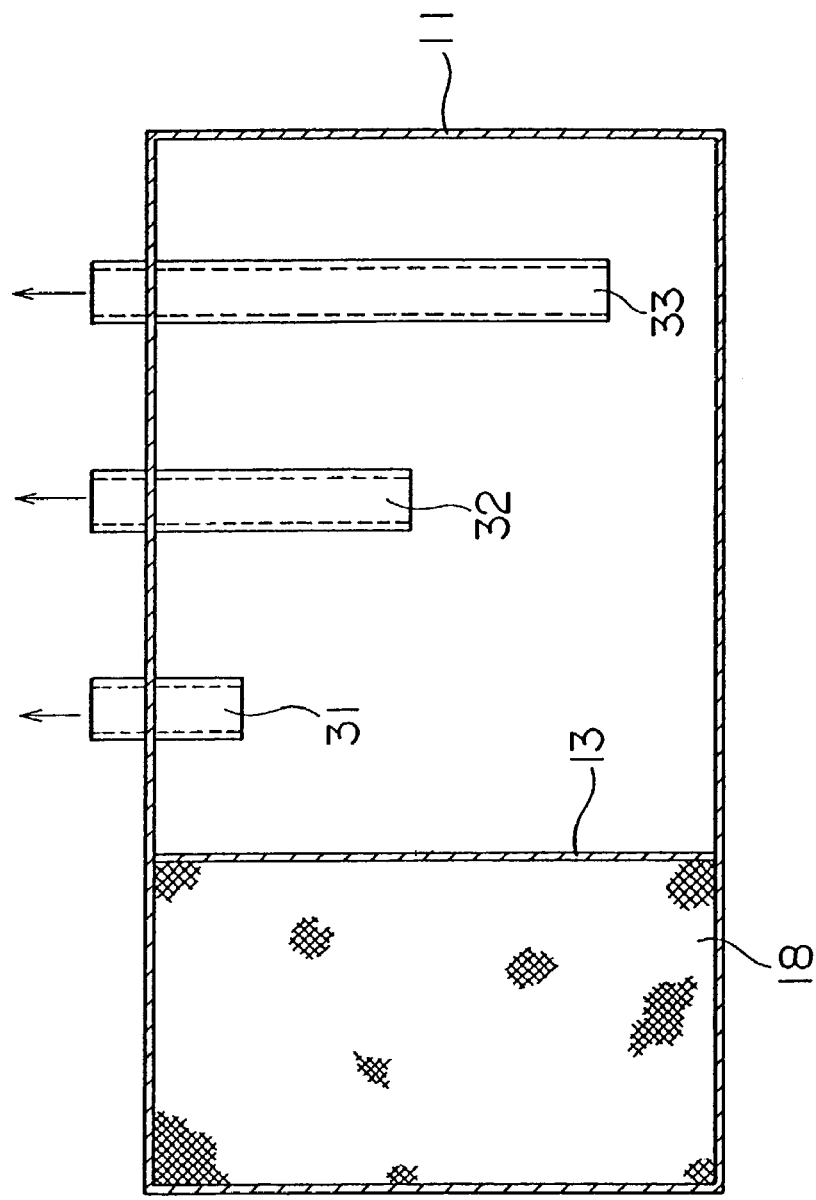
FIG. 3 is a section taken on line B—B of FIG. 1.

An embodiment of this invention will be described hereinafter with reference to the drawings. FIG. 1 is a view in vertical section of a substrate treating apparatus according to this invention. FIG. 2 is a section taken on line A—A of FIG. 1. FIG. 3 is a section taken on line B—B of FIG. 1.

This substrate treating apparatus is designed for removing a reaction product, which is an organic substance, from substrates. The apparatus removes, for example, a polymer as the reaction product from the surfaces of substrates, e.g. silicon semiconductor wafers, with a film formed thereon. The film noted above is, for example, a film of metal such as copper, aluminum, titanium or tungsten, or a film of a mixture of metals such as copper, aluminum, titanium and tungsten, or an insulating film such as a silicon oxide film, a silicon nitride film, an organic insulating film or a low dielectric layer insulating film.

This substrate cleaning apparatus includes an indexer 21 for loading and unloading a plurality of wafers W stored in cassettes 10, four wafer treating units 24 for treating the wafers W with treating liquids or solutions, and a pair of transport mechanisms 22 and 23 for transporting wafers W between the indexer 21 and wafer treating units 24.

The indexer 21, wafer treating units 24 and transport mechanisms 22 and 23 are enclosed in a casing 11. The casing 11 defines an opening 19 (FIG. 1) in a side wall adjacent the indexer 21 for transporting the cassettes 10 into and out of the apparatus.

One of the transport mechanisms 22 is movable back and forth in the vertical direction in FIG. 2 (in the direction perpendicular to the plane of FIG. 1) along a plurality of cassettes 10 placed on the indexer 21. The transport mechanism 22 takes the wafers W out of the cassettes 10, and puts the wafers W into the cassettes 10.

The other transport mechanism 23 is movable back and forth sideways in FIG. 2 along the wafer treating units 24. The transport mechanism 23 receives a wafer W to be treated from the transport mechanism 22 and transports the wafer W to one of the wafer treating units 24, and takes a treated wafer W out of one of the wafer treating units 24 and delivers the wafer W to the transport mechanism 22. The transfer of the wafers W between the transport mechanisms 22 and 23 is performed through an opening 15 (FIG. 2) formed in a partition 13 disposed in the casing 11.

The four wafer treating units 24 are enclosed in treating chambers 12, respectively. Each treating chamber 12 has an opening 14 (FIG. 2) formed in a position opposed to the transport mechanism 23 for allowing passage of the wafers W.

As shown in solid lines in FIG. 1 and in phantom lines in FIG. 2, a blower 25 is mounted above each treating chamber 12, i.e. each wafer treating unit 24, for feeding air into the treating chamber 12. A filter 28 is disposed below the blower 25 for filtering the air fed by the blower 25.

A pair of exhaust pipes 34 are arranged in lower positions of each treating chamber 12 for exhausting gas from the treating chamber 12. The wafer treating unit 24 inside each treating chamber 12 has an exhaust pipe 35, to be particularly described hereinafter, for exhausting gas from the wafer treating unit 24. The air fed from the blower 25 is exhausted through these exhaust pipes 34 and 35.

As shown in phantom lines in FIG. 2, a pair of blowers 26 are arranged in positions above the transport mechanism 23 for feeding air toward the transport mechanism 23. A filter is disposed below each blower 26.

As shown in FIGS. 1 and 3, three exhaust pipes 31, 32 and 33 of different lengths are arranged in positions below the transport mechanism 23 and treating chambers 12 for exhausting gas from areas below the transport mechanism 23 and treating chambers 12 in the casing 11. The air fed by the blowers 26 is exhausted mainly through these exhaust pipes 31, 32 and 33.

As shown in solid lines in FIG. 1 and in phantom lines in FIG. 2, a blower 27 is mounted above the indexer 21 and transport mechanism 22 for feeding air toward the indexer 21 and transport mechanism 22. A filter 28 is disposed below the blower 27 for filtering the air fed by the blower 27.

As shown in FIGS. 1 and 3, a perforated plate 18 is disposed in an area of the casing 11 below the indexer 21 and transport mechanism 22. The air fed from the blower 27 is exhausted mainly through this perforated plate 18.

In this substrate treating apparatus, side walls and a bottom wall of the casing 11, the partition 13 and a top wall 20 above the treating chambers 12 define a second chamber surrounding the treating chambers 12 and the transport mechanism 23. The blast capacities of blowers 25, 26 and 27 and the exhaust capacities of exhaust pipes 31, 32, 33, 34 and 35 are adjusted so that the air pressure in each treating chamber 12 is the lowest, the air pressure in the second chamber is the next lowest, and the air pressure around the indexer 21 and transport mechanism 22 is substantially equal to the air pressure in a cleanroom in which the substrate treating apparatus is installed. The blast capacities of blowers 25, 26 and 27 are such that the blower 27 is the most powerful, the blowers 26 are the next, and the blowers 25 the least powerful. That is, the blower 27 feeds the largest quantity of air, the blowers 26 feed the next largest quantity of air, and the blowers 25 feed the least.

Thus, part of the air fed by the blower 27 flows from around the indexer 21 and transport mechanism 22 into areas adjacent the transport mechanism 23 through the opening 15 in the partition 13. Part of the air fed by the blowers 26, and part of the air fed by the blower 27 and flowing from around the indexer 21 and transport mechanism 22 into the areas adjacent the transport mechanism 23 through the opening 15, flow into the treating chambers 12 through the openings 14 of the treating chambers 12.

Figure 4:
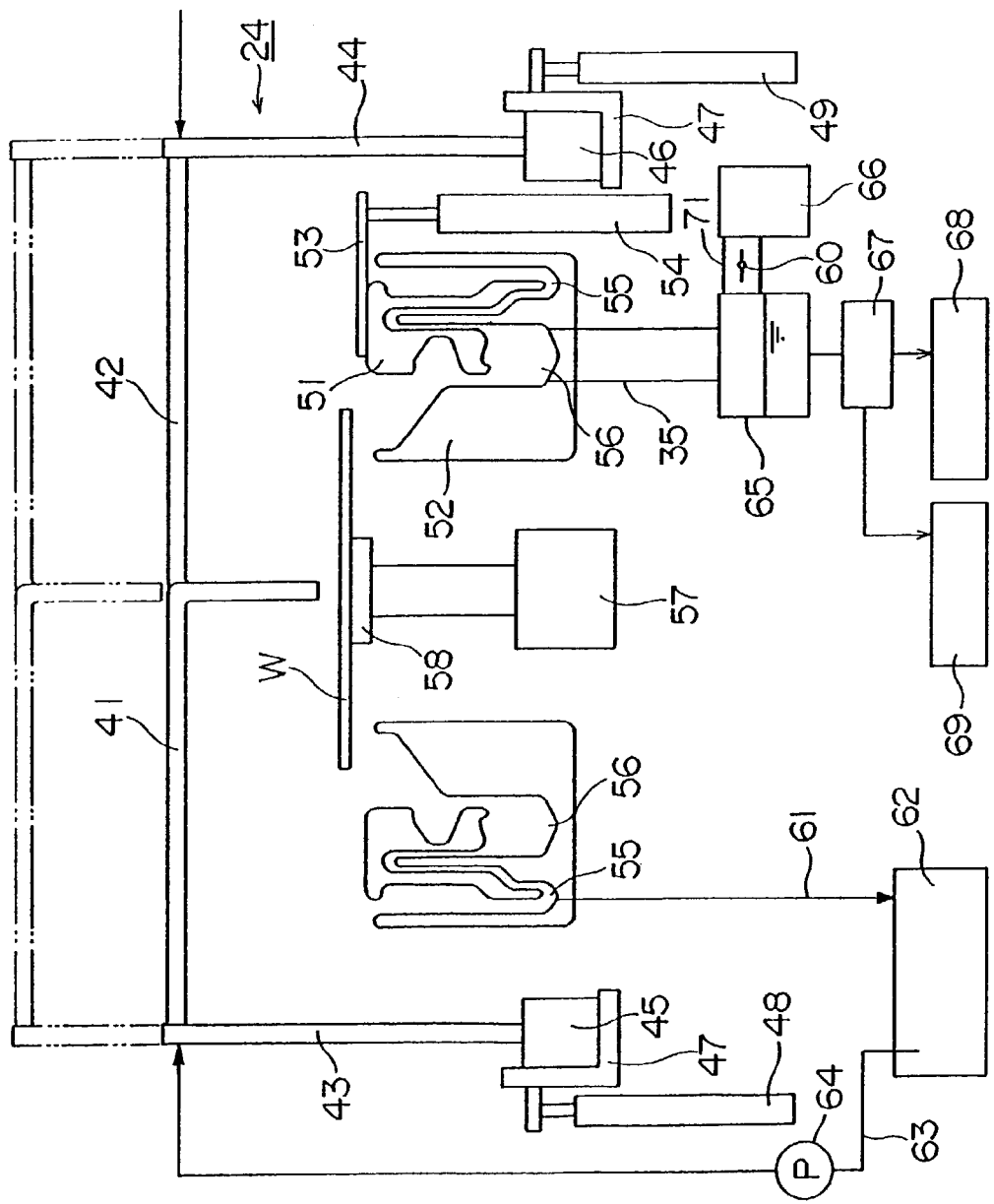
FIG. 4 is a schematic side view of a substrate treating unit.
Figure 5:
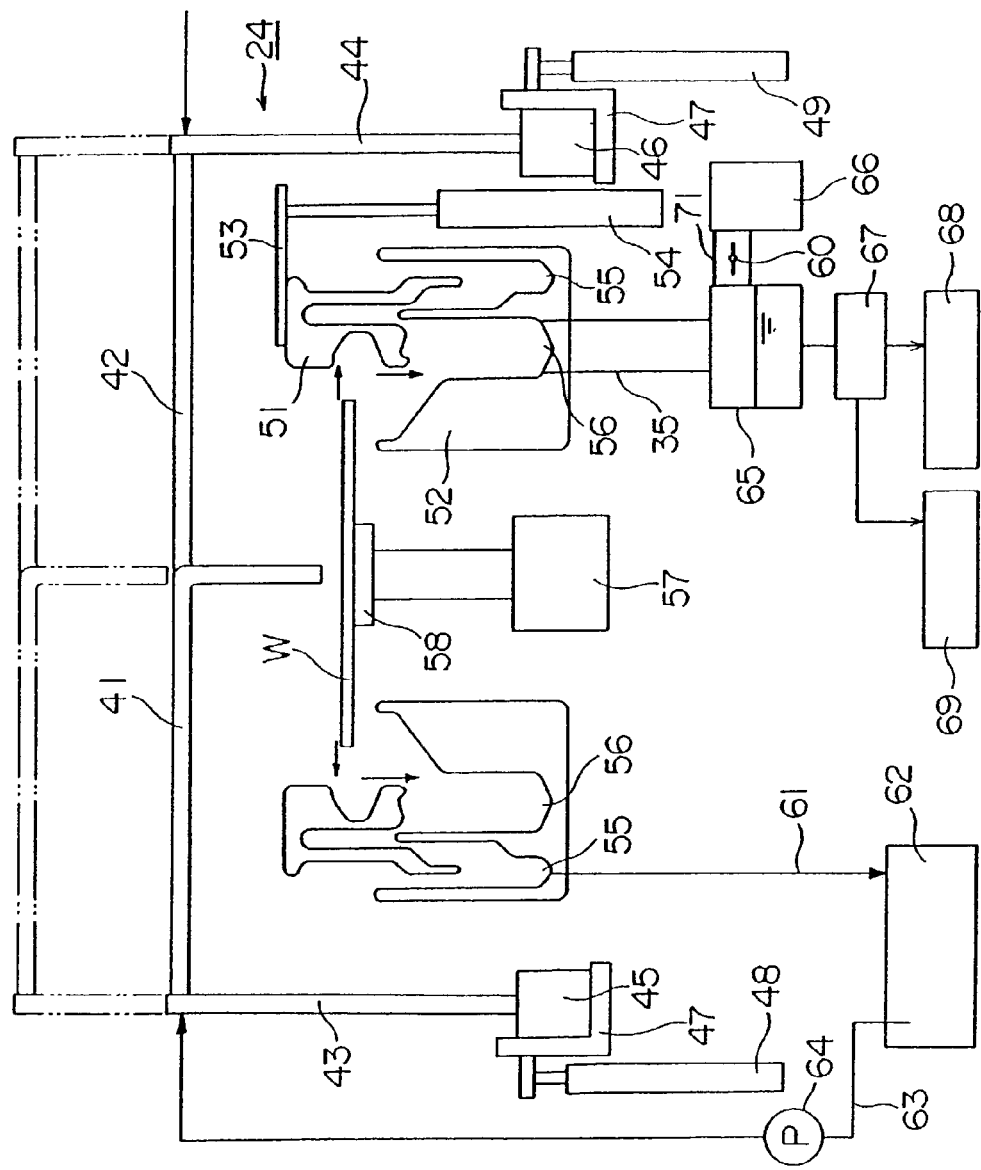
FIG. 5 is a schematic side view of the substrate treating unit.
Figure 6:
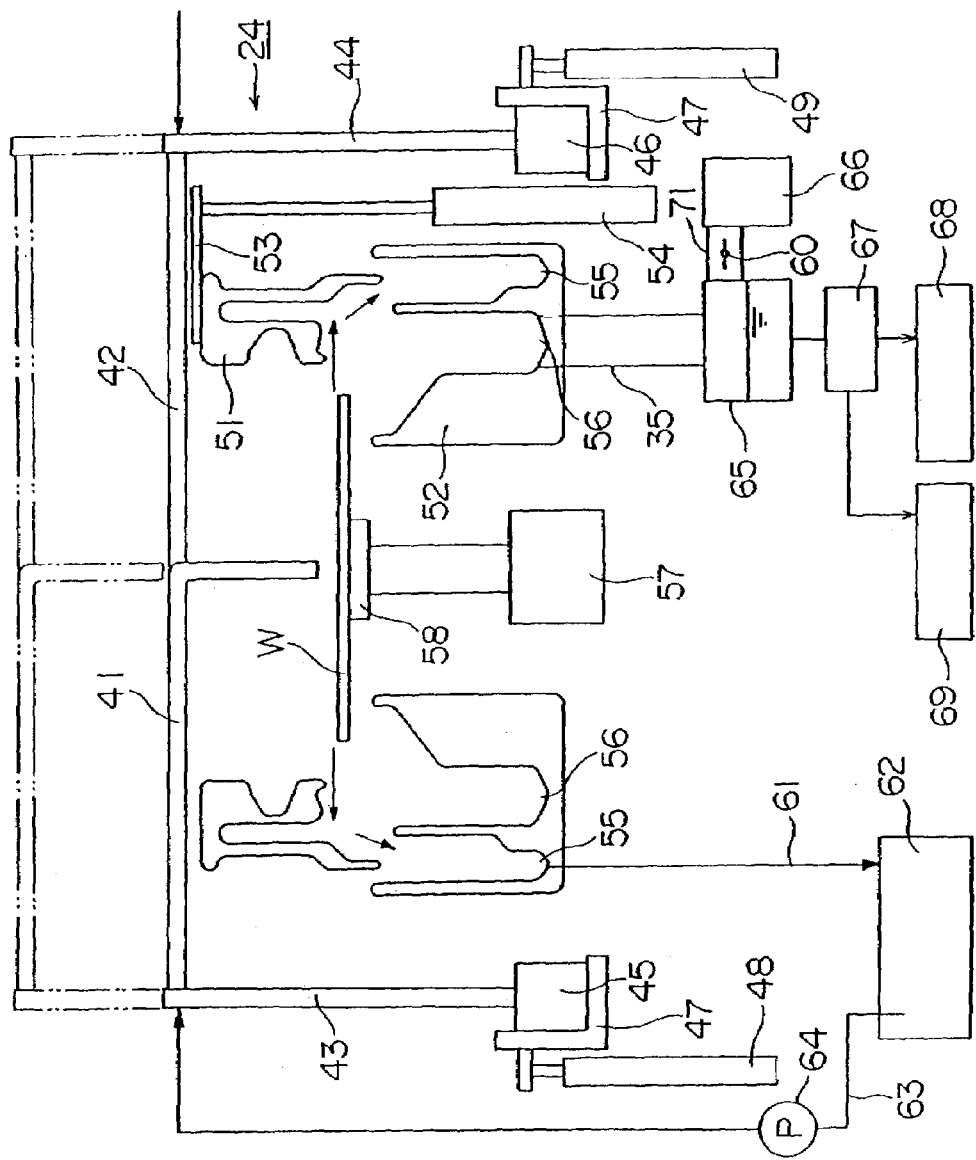
FIG. 6 is a schematic side view of the substrate treating unit.

The construction of the above wafer treating units 24 will be described next. FIGS. 4 through 6 are schematic side views of one of the wafer treating units 24.

The wafer treating unit 24 includes a spin chuck 58 driven by a motor 57 to rotate with a wafer W, a first nozzle 41 for supplying a removal liquid to the wafer W held by the spin chuck 58, a second nozzle 42 for supplying an intermediate rinse solution and deionized water to the wafer W held by the spin chuck 58, and an annular, vertically movable cup 51 and an annular fixed cup 52 for capturing the removal liquid, intermediate rinse solution and deionized water scattering from the wafer W in time of wafer treatment.

The first nozzle 41 is connected at a proximal end thereof to a support shaft 43 rotatably supported by a motor 45. The motor 45 is connected to an air cylinder 48 through a bracket 47. Thus, the first nozzle 41 is driven by the air cylinder 48 to move vertically between a removal liquid supplying position shown in solid lines in FIGS. 4 through 6, and a raised position shown in two-dot chain lines in FIGS. 4 through 6. Further, the first nozzle 41 is driven by the motor 45 to swing a distal end thereof between a position opposed to the center of wafer W held by the spin chuck 58, a position opposed to the vicinity of an edge of wafer W held by the spin chuck 58, and a position outside the movable cup 51 and fixed cup 52.

The first nozzle 41 is connected to a removal liquid reservoir 62 through a pipe 63. The removal liquid stored in the reservoir 62 is transmitted by action of a pump 64 to the first nozzle 41 and supplied from the first nozzle 41 to the surface of wafer W held by the spin chuck 58.

The removal liquid supplied from the first nozzle 41 to the wafer W is one for selectively removing a substance (e.g. an organic substance, a reaction product resulting from a change in property of the resist, the resist itself, or a polymer).

Removal liquids usable with this apparatus include a solution containing an organic alkali (called an organic alkaline removal liquid), a solution containing an organic amine, a solution containing an inorganic acid, and a solution containing an ammonium fluoride substance. The organic alkaline removal liquid may contain DMF (dimethylformamide), DMSO (dimethyl sulfoxide) or hydroxylamine. The solution containing an inorganic acid may contain hydrofluoric acid or phosphoric acid.

Other usable removal liquids include solutions containing 1-methyl-2-pyrrolidone, tetrahydrothiophene-1.1-dioxide, isopropanolamine, monoethanolamine, 2-(2-aminoethoxy) ethanol, catechol, N-methylpirrol-idone, aromatic diol, perchloroetylene or phenol. More particularly, the apparatus may use a mixed solution of 1-methyl-2-pyrrolidone, tetrahydrothiophene-1.1-dioxide and isopropanolamine, a mixed solution of dimethylsulfoxide and monoethanolamine, a mixed solution of 2-(2-aminoethoxy) ethanol, hydroxyamine and catechol, a mixed solution of 2-(2-aminoethoxy) ethanol and N-methylpirrolidone, a mixed solution of monoethanolamine, water and aromatic diol, and a mixed solution of perchloroethylene and phenol.

The solution containing an organic amine (called an organic amine-based removal liquid) may be a mixed solution of monoethanolamine, water and aromatic triol, a mixed solution of 2-(2-aminoethoxy) ethanol, hydroxyamine and catechol, a mixed solution of alkanolamine, water, dialkylsulfoxide, hydroxyamine and an amine-based anticorrosive, a mixed solution of alkanolamine, glycol ether and water, a mixed solution of dimethylsulfoxide, hydroxyamine, triethylene-tetramine, pyrocatechol and water, a mixed solution of water, hydroxyamine and pyrogallol, a mixed solution of 2-amino-ethanol, ether and sugar alcohol, or a mixed solution of 2-(2-aminoethoxy) ethanol, N,N-dimethylacetamide, water and triethanolamine.

The solution containing an ammonium fluoride substance (called an ammonium fluoride removal liquid) may be a mixed solution of an organic alkali, sugar alcohol and water, a mixed solution of a fluorine compound, an organic carboxylic acid and an acid/amide-based solvent, a mixed solution of alkylamide, water and ammonium fluoride, a mixed solution of dimethylsulfoxide, 2-aminoethanol, an aqueous solution of an organic alkali and aromatic hydrocarbon, a mixed solution of dimethylsulfoxide, ammonium fluoride and water, a mixed solution of ammonium fluoride, triethanolamine, pentamethyldiethylene triamine, iminodiacetate and water, a mixed solution of glycol, alkyl sulfate, organic salt, organic acid and inorganic salt, or a mixed solution of amide, organic salt, organic acid and inorganic salt.

Further, an inorganic removal liquid containing an inorganic substance may be a mixed solution of water and a phosphoric acid derivative.

An ammonium fluoride removal liquid may have an organic alkaline ingredient added thereto. Such a removal liquid then contains the alkaline ingredient.

The second nozzle 42 is connected at a proximal end thereof to a support shaft 44 rotatably supported by a motor 46. The motor 46 is connected to an air cylinder 49 through the bracket 47. Thus, the second nozzle 42 is driven by the air cylinder 49 to move vertically between a deionized water supplying position shown in solid lines in FIGS. 4 through 6, and a raised shown in two-dot chain lines in FIGS. 4 through 6. Further, the second nozzle 42 is driven by the motor 46 to swing a distal end thereof between a position opposed to the center of wafer W held by the spin chuck 58, a position opposed to the vicinity of an edge of wafer W held by the spin chuck 58, and a position outside the movable cup 51 and fixed cup 52.

The second nozzle 42 has, at the distal end thereof, an intermediate rinse nozzle and a deionized water nozzle, not shown, connected by piping to an intermediate rinse solution source and a deionized water source, not shown, respectively. The intermediate rinse solution supplied from the intermediate rinse solution source and deionized water supplied from the deionized water source are supplied from the intermediate rinse nozzle and deionized water nozzle arranged at the distal end of the second nozzle 42 to the surface of wafer W held by the spin chuck 58.

The intermediate rinse solution supplied from the intermediate rinse nozzle of the second nozzle 42 to the wafer W is a liquid for washing the removal liquid away from the wafer W. This liquid may, for example, be an organic solvent such as isopropyl alcohol (IPA), or functional water such as ozone water with ozone dissolved in deionized water, hydrogen water with hydrogen dissolved in deionized water, or carbonated water with carbon dioxide dissolved in deionized water.

The vertically movable cup 51 is connected to an air cylinder 54 through a support 53. Thus, the movable cup 51 is driven by the air cylinder 54 to move vertically between a position shown in FIG. 4 for allowing loading and unloading of the wafer W, a drainage collecting position shown in FIG. 5, and a removal liquid collecting position shown in FIG. 6.

When the movable cup 51 is in the position shown in FIG. 4, the transport mechanism 23 shown in FIG. 1 may transport the wafer W into or out of the wafer treating unit 24. In the drainage collecting position shown in FIG. 5, the movable cup 51 captures the intermediate rinse solution or deionized water scattering from the wafer W when the intermediate rinse solution or deionized water is supplied to the wafer W for treatment of the wafer W. In the removal liquid collecting position shown in FIG. 6, the movable cup 51 captures the removal liquid scattering from the wafer W when the removal liquid is supplied to the wafer W for treatment of the wafer W.

The fixed cup 52 has a first recess 55 formed circumferentially, and a second recess 56 formed circumferentially and inwardly of the first recess 55. The first recess 55 is used for collecting the removal liquid captured by the movable cup 51 in the removal liquid collecting position shown in FIG. 6. The second recess 56 is used for collecting the intermediate rinse solution or deionized water captured by the movable cup 51 in the drainage collecting position shown in FIG. 5.

The first recess 55 is connected to the removal liquid reservoir 62 through piping 61. The removal liquid collected in the first recess 55 is once stored in the removal liquid reservoir 62, and thereafter transmitted by the action of circulating pump 64 to the first nozzle 41 again to be supplied to the surface of wafer W held by the spin chuck 58.

The second recess 56 is connected to a gas-liquid separator 65 through the exhaust pipe 35 noted hereinbefore. This exhaust pipe 35 is provided for discharging gas from the wafer treating unit 24 and for collecting the intermediate rinse solution or deionized water captured by the movable cup 51. That is, the exhaust pipe 35 acts as an intermediate rinse solution collecting line and a deionized water collecting line.

The gas-liquid separator 65 connected to the exhaust pipe 35 is capable of temporarily storing, in the bottom thereof, the intermediate rinse solution or deionized water captured by the movable cup 51. In a region above the surface of the intermediate rinse solution or deionized water temporarily stored therein, the gas-liquid separator 65 is connected to an exhaust mechanism 66 through an exhaust regulating pipe 71. At the bottom thereof, the gas-liquid separator 65 is connected to a separating and collecting mechanism 67. This separating and collecting mechanism 67 is operable to transmit separately the intermediate rinse solution captured by the movable cup 51 to an intermediate rinse solution collecting drain 68, and the deionized water captured by the movable cup 51 to a deionized water collecting drain 69.

Thus, the intermediate rinse solution and deionized water collected in the second recess 56 may be collected separately in the intermediate rinse solution collecting drain 68 and deionized water collecting drain 69. In time of a collecting operation, the exhaust mechanism 66 is operable to exhaust gas from the wafer treating unit 24. A volume of exhaust may be controlled by an exhaust regulating valve 60 mounted in the exhaust regulating pipe 71.

That is, the exhaust regulating valve 60, when set to the position shown in FIG. 7, minimizes the exhaust through the exhaust pipe 35, and when turned to the position shown in FIG. 8, increases the exhaust through the exhaust pipe 35. The exhaust may be adjusted to a desired value by adjusting an angle of rotation of the exhaust regulating valve 60. The angle of rotation of the exhaust regulating valve 60 is controlled by a control unit 100 described hereinafter.

Figure 9:
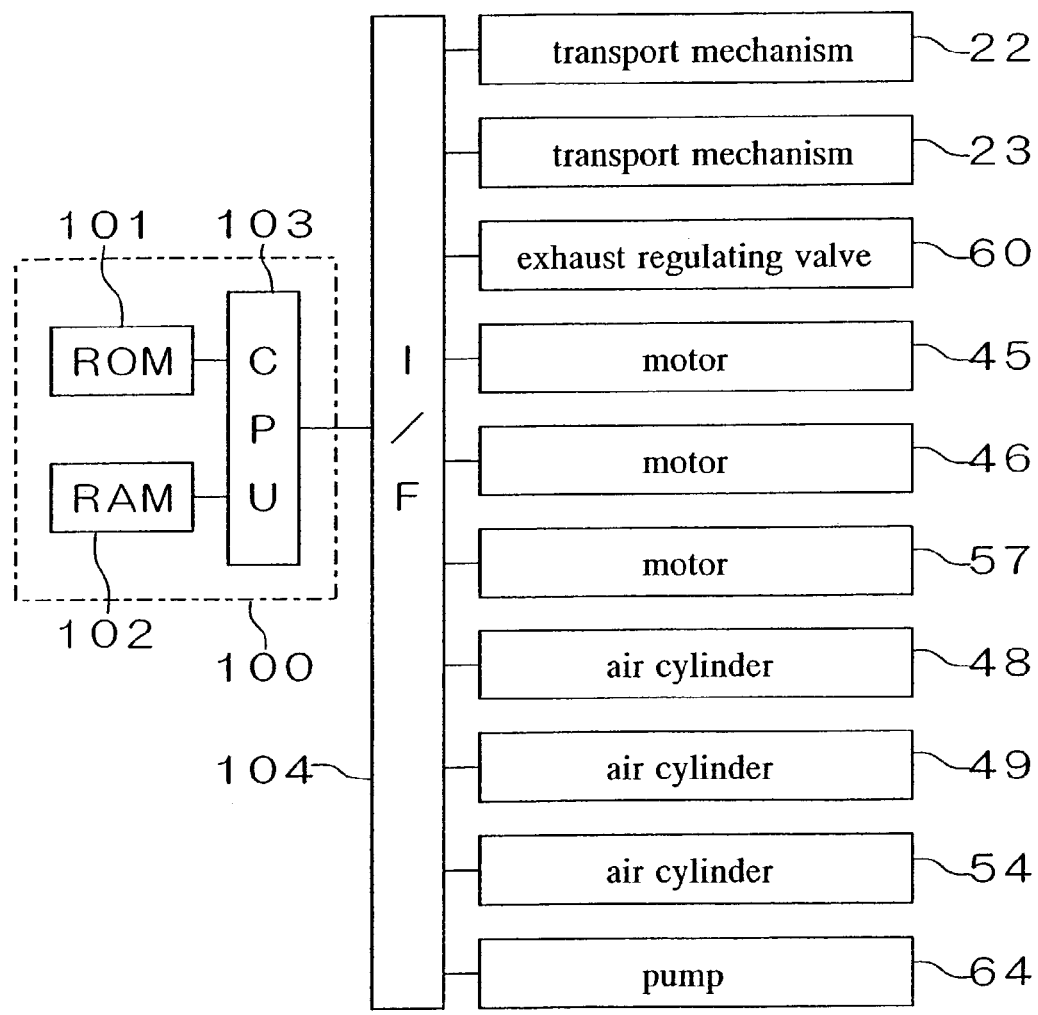
FIG. 9 is a block diagram showing a principal electrical structure of the substrate treating apparatus.

FIG. 9 is a block diagram showing a principal electrical structure of the above substrate treating apparatus.

This substrate treating apparatus includes the control unit 100 having a ROM 101 for storing operating programs necessary for controlling the apparatus, a RAM 102 for temporarily storing data and the like during a control operation, and a CPU 103 for performing logic operations. The control unit 100 is connected through an interface 104 to the pair of transport mechanisms 22 and 23, exhaust regulating valve 60, motors 45, 46 and 57, air cylinders 48, 49 and 54, and pump 64.

Next, an operation of this wafer treating unit 24 for treating a wafer W will be described.

When the transport mechanism 23 loads a wafer W to be treated into the wafer treating unit 24, the movable cup 51 is lowered to the position shown in FIG. 4 for allowing loading and unloading of the wafer W. The distal ends of the first nozzle 41 and second nozzle 42 are kept outside the movable cup 51 and fixed cup 52.

At this time, the exhaust regulating valve 60 is set to the position shown in FIG. 8, and the exhaust mechanism 66 constantly and forcibly exhausts gas from inside the movable cup 51 and fixed cup 52 through the second recess 56 in the fixed cup 52 and through the exhaust pipe 35. Thus, combined with the operation to exhaust gas from the wafer treating unit 24 through the exhaust pipes 34, the above action of the exhaust mechanism 66 reliably prevents diffusion to the ambient of chemicals generating during various types of treatment of the wafer W.

After the transport mechanism 23 places the wafer W on the spin chuck 58, the movable cup 51 is raised to the removal liquid collecting position as shown in FIG. 6. Thereafter, the air cylinder 48 is operated to raise the first nozzle 41 once to the upper position shown in two-dot chain lines in FIG. 6, and then the motor 45 is operated to rotate the support shaft 43, thereby moving the distal end of first nozzle 41 from the position outside the movable cup 51 and fixed cup 52 to the position opposed to the center of the wafer W held by the spin chuck 58. Next, the air cylinder 48 is operated to lower the first nozzle 41 to the removal liquid supplying position shown in solid lines in FIG. 6.

Further, under control of the control unit 100, the exhaust regulating valve 60 is set to the position shown in FIG. 7. This results in a decrease in the exhaust from the movable cup 51 and fixed cup 52.

In this state, a removing process is carried out for removing the reaction product by supplying the removal liquid to the wafer W. This removing process includes a removal liquid supplying step, a removal liquid retaining step and a removal liquid scattering step.

The removal liquid supplying step is executed first. In the removal liquid supplying step, the control unit 100 controls the motor 57 to spin the spin chuck 58 at a first speed (e.g. 300 to 3,000 rpm). The first nozzle 41 is used to supply the removal liquid from the vertically upper position to the center of wafer W spinning at the first speed. Next, the control unit 100 controls the motor 57 to reduce the spinning speed of wafer W from the first speed to a second speed (e.g. 0 to 200 rpm). The first nozzle 41 is used again to supply the removal liquid from the vertically upper position to the center of wafer W spinning at the second speed.

Next, the removal liquid retaining step is executed for retaining the removal liquid on the surface of wafer W for a fixed time. The removal liquid retaining step consists of one of the following three steps, i.e. a low-speed spinning step, an intermittent spinning step and a resting step, executed after stopping the supply of the removal liquid from the first nozzle 41. In the low-speed spinning step, the wafer W is spun at a speed (e.g. a rotational frequency greater than 0 rpm and not exceeding 50 rpm) for allowing the removal liquid to remain on the wafer W without dispersing therefrom. In the intermittent spinning step, the wafer W is spun intermittently in a way to allow the removal liquid to remain on the wafer W. In the resting step, the wafer W is maintained still.

Whichever of the low-speed spinning step, intermittent spinning step and resting step is adopted, it is preferable to maintain the entire surface of wafer W covered by the removal liquid.

By supplying the removal liquid from the vertically upper position to the center of wafer W spinning at the relatively fast, first speed as noted above, the enter surface of wafer W is quickly wetted with the removal liquid. When the removal liquid is supplied from the upper position to the center of wafer W spinning at the second speed lower than the first speed, the entire surface of wafer W has already been wetted with the removal liquid, and the removal liquid spreads evenly over the surface of wafer W from the center toward peripheries. Since the wafer W spins at the relatively slow, second speed at this time, the removal liquid covering the wafer W remains in the form of a puddle thereon. In this state, the wafer W is spun at a speed for allowing the removal liquid to remain on the wafer W, or spun intermittently in a way to allow the removal liquid to remain on the wafer W, or maintained still. Then, the treatment progresses with the removal liquid acting on and removing the reaction product.

Particularly when the wafer W is spun at a speed for allowing the removal liquid to remain on the wafer W, or spun intermittently in a way to allow the removal liquid to remain on the wafer W, the removal liquid on the spinning wafer W tends to stand still by inertia, resulting in a relative movement between the surface of wafer W and removal liquid. Thus, the removal liquid flows on the wafer W instead of stagnating on particular locations thereon. A permutation occurs within the removal liquid on the wafer W, whereby the removal liquid on the wafer W is used efficiently in the treatment. Consequently, the reaction product is removed reliably while restraining the quantity of the removal liquid used.

In the low-speed spinning step and intermittent spinning step, the wafer W is spun in a way to allow the removal liquid to remain on the wafer W without dispersing therefrom. At this time, part of the removal liquid may be allowed to scatter away as long as the removal liquid remains on part of the wafer W. However, it is preferable that the removal liquid covers the entire surface of wafer W.

The removal liquid scattering step is executed next. In the scattering step, the spin chuck 58 is spun at a third speed faster than the above first and second speeds to scatter the removal liquid from the wafer W.

The removal liquid scattering from the edge of the wafer W is captured by the lower end of vertically movable cup 51 as indicated by arrows in FIG. 6, and collected in the removal liquid reservoir 62 through the first recess 55 in the fixed cup 52. In this way, reuse may be made of the expensive removal liquid.

Upon completion of the process of removing the reaction product by using the removal liquid, the distal end of first nozzle 41 is moved outside the movable cup 51 and fixed cup 52 by an operation reversed from the foregoing operation. In addition, the separating and collecting mechanism 67 is driven for the liquid flowing into the exhaust pipe 35 to be collected in the intermediate rinse solution collecting drain 68.

When removing the reaction product with the removal liquid, the exhaust regulating valve 60 is set to the position shown in FIG. 7 under control of the control unit 100, to decrease the exhaust of gas from the cup including the movable cup 51 and fixed cup 52. This effectively prevents vaporization of moisture from the removal liquid, ruffling of the surface of the removal liquid, and lowering of the reaction product removing performance due, for example, to oxidation of the removal liquid.

The lowering of the reaction product removing performance may be avoided by setting the exhaust regulating valve 60 to the position shown in FIG. 7, in the removal liquid retaining step at least, to decrease the exhaust of gas from the cup including the movable cup 51 and fixed cup 52.

The gas containing the components of the removal liquid may be prevented from entering the gas-liquid separator 65 in large quantities through the exhaust pipe 35. Consequently, the gas containing the components of the removal liquid is restrained from mixing into the deionized water in the gas-liquid separator 65, thereby alleviating the burden on waste water disposal equipment.

As noted above, even when the exhaust of gas from the cup including the movable cup 51 and fixed cup 52, gas is exhausted from the treating chamber 12 through the exhaust pipes 34. Thus, the gas never disperses from the treating chamber 12 to the ambient.

Next, the exhaust regulating valve 60 is set to the position shown in FIG. 8 under control of the control unit 100. This restores the exhaust of gas from the cup including the movable cup 51 and fixed cup 52 to the normal state.

Then, the movable cup 51 is lowered to the drainage collecting position shown in FIG. 5. The air cylinder 49 is operated to raise the second nozzle 42 once to the upper position shown in two-dot chain lines in FIG. 5, and then the motor 46 is operated to rotate the support shaft 44, thereby moving the distal end of second nozzle 42 from the position outside the movable cup 51 and fixed cup 52 to the position opposed to the center of the wafer W held by the spin chuck 58. Next, the air cylinder 49 is operated to lower the second nozzle 42 to the position shown in solid lines in FIG. 5 for supplying the intermediate rinse solution.

In this state, the wafer W is spun with the spin chuck 58, and the intermediate rinse solution is supplied from the intermediate rinse solution nozzle of second nozzle 42 to the surface of wafer W to clean the wafer W.

At this time, the intermediate rinse solution scattering from the edge of the wafer W is captured by the side wall of movable cup 51 as indicated by arrows in FIG. 5. The intermediate rinse solution flows through the second recess 56 of fixed cup 52 and through the exhaust pipe 35 into the gas-liquid separator 65, and then through the separating and collecting mechanism 67 to the intermediate rinse solution collecting drain 68.

After the cleaning process using the intermediate rinse solution, the separating and collecting mechanism 67 is driven for causing the liquid flowing into the exhaust pipe 35 to be collected in the deionized water collecting drain 69. Then, the wafer W is spun with the spin chuck 58, and the deionized water is supplied from the second nozzle 42 to the surface of wafer W to clean the wafer W.

At this time, the deionized water scattering from the edge of the wafer W is captured by the side wall of movable cup 51 as indicated by arrows in FIG. 5. The deionized water flows through the second recess 56 of fixed cup 52 and through the exhaust pipe 35 into the gas-liquid separator 65, and then through the separating and collecting mechanism 67 to the deionized water collecting drain 69.

After the cleaning process using the deionized water, the distal end of the second nozzle 42 is moved outside the movable cup 51 and fixed cup 52. The movable cup 51 is lowered to the position for allowing loading and unloading of the wafer W. Then, the transport mechanism 23 unloads the wafer W from the spin chuck 58.

In this embodiment, the exhaust mechanism 66 is connected to the gas-liquid separator 65 through the exhaust regulating pipe 71, and the gas in the cup is exhausted through the piping (exhaust pipe 35) connecting the gas-liquid separator 65 to the second recess 56. Instead, the exhaust regulating pipe 71 may be connected directly to the second recess 56.

In the above substrate treating apparatus, the intermediate rinse nozzle and deionized water nozzle are mounted in the second nozzle 42. The intermediate rinse nozzle may be omitted, and furthermore, a rinse nozzle may be provided in place of the deionized water nozzle. Then, the rinse nozzle is connected by piping to a rinse liquid source. In this case, the second nozzle having the rinse nozzle, the rinse liquid source, and the piping between the rinse nozzle and rinse liquid source, constitute the rinse liquid supplying device.

The rinse liquid may be, besides deionized water, functional water such as ozone water with ozone dissolved in deionized water, hydrogen water with hydrogen dissolved in deionized water, or carbonated water. The rinse water, preferably, is a liquid such as one of those cited above that turns into deionized water when left standing at normal temperature (about 20 to 28 deg C.) and normal pressure (about one atmospheric pressure).

Thus, where a rinse nozzle is provided in place of the intermediate rinse nozzle as noted above, the separating and collecting mechanism 67 is driven, after completion of the removing process using the removal liquid, for causing the liquid flowing into the exhaust pipe 35 to be collected in the deionized water collecting drain 69. Then, the wafer W is spun with the spin chuck, and a rinse liquid is delivered from the rinse nozzle of second nozzle 42 to supply the rinse liquid to the surface of wafer W.

Such a construction is effective to prevent the gas containing the components of the removal liquid from entering the rinse liquid collecting line in large quantities, thereby alleviating the burden on waste water disposal equipment.

The above embodiment discloses a process for removing a polymer, which is a reaction product generated during dry etching, from the wafer having undergone the dry etching. However, the invention is not limited to the removal from the wafer of a reaction product generated during dry etching. For example, the invention is applicable also to removal from the wafer of a reaction product generated during plasma ashing.

When an impurity diffusion process is carried out with a resist film acting as a mask, the whole or part of the resist film changes into a reaction product. The invention includes the case of removing such reaction product also.

Thus, the invention is applicable also to removal from substrates of reaction products resulting from resists during various processes not limited to dry etching.

Further, the invention is not limited to removal of the resist-originated reaction product from the substrate, but includes also a case of removing the resist itself from the substrate.

For example, a resist may be applied to a substrate to form a resist film thereon, a pattern (e.g. a wiring pattern) is exposed on the resist film, and the exposed resist film is developed. The pattern defined by the developed resist film may be used as a mask to perform a lower film process on a film (which is called a lower film) present under the resist. The invention is applicable also to removal of the resist film no longer necessary after the lower film process.

More particularly, for example, the lower film may be etched after development of the resist film. Whether the etching process is wet etching or dry etching such as RIE, the resist film becomes unnecessary and should be removed after the etching process. The invention includes also such resist removal following the etching process.

Further, in a different case of removing a resist itself from a substrate, an impurity diffusion process may be conducted as a lower film process after the resist film is developed. The resist film becomes unnecessary and should be removed after the diffusion process. The invention includes also such resist removal.

In these cases, any reaction product resulting from a change in property of the resist film may be removed together with the unwanted resist film. This is advantageous in improving throughput and reducing cost.

When, for example, the lower film is dry-etched in the above etching process, a resist-originated reaction product is also generated. As a result, the resist film itself serving as a mask for the lower film during the dry etching and the reaction product resulting from a change in property of the resist film may be removed at the same time.

A resist-originated reaction product is generated also when the impurity diffusion process (e.g. ion implantation) is conducted on the lower film. Consequently, the resist film itself serving as a mask for the lower film during the impurity diffusion process and the reaction product resulting from a change in property of the resist film may be removed at the same time.

Furthermore, according to the invention, it is possible to remove not only the resist-originated reaction product and the resist itself, but also organic matter not originating from the resist, such as minute contaminants emanating from the human body.

This invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 2002-24365 filed in the Japanese Patent Office on Jan. 31, 2002, the entire disclosure of which is incorporated herein by reference.

What is claimed is:

1. A substrate treating method for removing, by using a removal liquid, a reaction product from a surface of a substrate having a film formed on the surface and patterned by dry etching with a resist film acting as a mask, said method comprising:
   a removal liquid supplying step for supplying the removal liquid to the surface of the substrate while spinning the substrate; and
   a removal liquid retaining step for retaining the removal liquid on the surface of the substrate for a fixed time;
   wherein said removal liquid supplying step is executed for supplying the removal liquid to the substrate while spinning the substrate at a first speed, and thereafter supplying the removal liquid to the substrate while spinning the substrate at a second speed lower than the first speed.

2. A substrate treating method as defined in claim 1, wherein said removal liquid retaining step is executed, after the removal liquid is supplied to the surface of the substrate, for spinning the substrate at such a low speed as to retain the removal liquid on the substrate.

3. A substrate treating method as defined in claim 1, wherein said removal liquid retaining step is executed, after the removal liquid is supplied to the surface of the substrate, for spinning the substrate intermittently.

4. A substrate treating method as defined in claim 1, wherein said removal liquid retaining step is executed, after the removal liquid is supplied to the surface of the substrate, for temporarily stopping spinning of the substrate.

5. A substrate treating method as defined in claim 1, wherein said removal liquid retaining step is followed by:
   a removal liquid scattering step for scattering the removal liquid from the surface of the substrate by spinning the substrate at high speed; and
   a substrate cleaning step for cleaning the substrate.

6. A substrate treating method as defined in claim 5, wherein said removal liquid supplying step, said removal liquid retaining step, said removal liquid scattering step and said substrate cleaning step are executed while the substrate is placed in a cup being exhausted, said cup being less exhausted during said removal liquid retaining step.

7. A substrate treating method for removing organic substance from a substrate by using a removal liquid, said method comprising:
   a removal liquid supplying step for supplying the removal liquid to a surface of the substrate; and
   a removal liquid retaining step for retaining the removal liquid on the surface of the substrate for a fixed time;
   wherein said removal liquid supplying step is executed for supplying the removal liquid to the substrate while spinning the substrate; and
   wherein said removal liquid retaining step is executed, after the removal liquid is supplied to the surface of the substrate, for spinning the substrate at such a low speed as to retain the removal liquid on the substrate.

8. A substrate treating method as defined in claim 7, wherein said removal liquid retaining step is followed by:
   a removal liquid scattering step for scattering the removal liquid from the surface of the substrate by spinning the substrate at high speed; and
   a substrate cleaning step for cleaning the substrate.

9. A substrate treating method as defined in claim 7, wherein said organic substance is a reaction product resulting from a dry etching with a resist film used as a mask.

10. A substrate treating method as defined in claim 7, wherein said organic substance is a polymer.

11. A substrate treating method as defined in claim 7, wherein said organic substance is a reaction product resulting from a change in property of a resist.

12. A substrate treating method for removing organic substance from a substrate by using a removal liquid, said method comprising:
    a removal liquid supplying step for supplying the removal liquid to a surface of the substrate; and
    a removal liquid retaining step for retaining the removal liquid on the surface of the substrate for a fixed time;
    wherein said removal liquid supplying step is executed for supplying the removal liquid to the substrate while spinning the substrate; and
    wherein said removal liquid supplying step is executed for supplying the removal liquid to the substrate while spinning the substrate at a first speed, and thereafter supplying the removal liquid to the substrate while spinning the substrate at a second speed lower than the first speed.

13. A substrate treating method as defined in claim 12, wherein said removal liquid retaining step is executed, after the removal liquid is supplied to the surface of the substrate, for spinning the substrate intermittently.

14. A substrate treating method as defined in claim 12, wherein said removal liquid retaining step is executed, after the removal liquid is supplied to the surface of the substrate, for temporarily stopping spinning of the substrate.

15. A substrate treating method as defined in claim 12, wherein said removal liquid retaining step is followed by:
    a removal liquid scattering step for scattering the removal liquid from the surface of the substrate by spinning the substrate at high speed; and
    a substrate cleaning step for cleaning the substrate.

16. A substrate treating method for removing organic substance from a substrate by using a removal liquid, said method comprising:
    a removal liquid supplying step for supplying the removal liquid to a surface of the substrate; and
    a removal liquid retaining step for retaining the removal liquid on the surface of the substrate for a fixed time;
    wherein said removal liquid supplying step is executed for supplying the removal liquid to the substrate while spinning the substrate; and
    wherein said removal liquid supplying step, said removal liquid retaining step, said removal liquid scattering step and said substrate cleaning step are executed while the substrate is placed in a cup being exhausted, said cup being less exhausted during said removal liquid retaining step.

17. A substrate treating method as defined in claim 16, wherein said removal liquid retaining step is followed by:

a removal liquid scattering step for scattering the removal liquid from the surface of the substrate by spinning the substrate at high speed; and a substrate cleaning step for cleaning the substrate.

* * * * *